United States Patent [19]
Altman

[11] 3,951,534
[45] *Apr. 20, 1976

[54] SHORT THROW, OBLIQUE INCIDENCE, VISUAL TRANSPARENCY PROJECTOR

[76] Inventor: Gerald Altman, 41 Westminster Road, Newton Centre, Mass. 02159

[ * ] Notice: The portion of the term of this patent subsequent to Apr. 20, 1993, has been disclaimed.

[22] Filed: Dec. 23, 1974

[21] Appl. No.: 535,694

Related U.S. Application Data

[63] Continuation-in-part of Ser. No. 500,322, Aug. 26, 1974, which is a continuation-in-part of Ser. No. 329,574, Feb. 5, 1973, Pat. No. 3,837,739, and a continuation-in-part of Ser. No. 419,063, Nov. 26, 1973, Pat. No. 3,915,567, said Ser. Nos. 329,574, and Ser. No. 419,063, each is a continuation-in-part of Ser. No. 81,987, Oct. 10, 1970, Pat. No. 3,778,142.

[52] U.S. Cl. .................................... 353/64; 353/71; 353/70
[51] Int. Cl.² .......................................... G03B 21/00
[58] Field of Search .............................. 353/63–66, 353/71, 119, 70; 350/199, 303, 304, 55

[56] References Cited
UNITED STATES PATENTS
3,762,809  10/1973  Kato et al. ............................ 353/66

Primary Examiner—Houston S. Bell, Jr.
Assistant Examiner—Larry Jones
Attorney, Agent, or Firm—Morse, Altman, Oates & Bello

[57] ABSTRACT

A visual transparency projector has a short throw, oblique incidence catadioptric optical system, capable of enabling (1) a viewing screen and (2) the projector with its operator to be seen by an audience in side-by-side relation.

14 Claims, 5 Drawing Figures

SHORT THROW, OBLIQUE INCIDENCE, VISUAL TRANSPARENCY PROJECTOR

RELATED APPLICATIONS

The present application is a continuation-in-part of application Ser. No. 500,322, filed Aug. 26, 1974, which in turn is a continuation-in-part of Ser. No. 329,574, filed Feb. 5, 1973, now Pat. No. 3,837,739, issued Sept. 24, 1974, and a continuation-in-part of application Ser. No. 419,063, filed Nov. 26, 1973, now U.S. Pat. No. 3,915,567, both the latter two applications, in turn, being continuations-in-part of application Ser. No. 81,987, filed Oct. 19, 1970, now Pat. No. 3,778,142, issued Dec. 11, 1973, and reissued as Pat. No. Re28,274, dated Dec. 17, 1974.

BACKGROUND AND SUMMARY

The present invention relates to large copy projectors and, more particularly, to visual transparency projectors of the type in which a large transparency to be marked and/or observed by an operator is imaged on a viewing screen for display to an audience.

Visual transparency projectors of the prior art, usually known as overhead projectors, have been characterized by bulky hardware that obtrudes between the audience and the viewing screen and causes the operator to assume an unnatural posture in an effort not to obtrude between the audience and the viewing screen.

The primary object of the present invention is the provision of a visual transparency projector characterized by a short throw, oblique incidence catadioptric optical system, capable of enabling (1) a viewing screen and (2) the projector with its operator to be seen by an audience in side-by-side relation with minimal keystoning. Specifically, the projector comprises a Fresnel lens for supporting the visual transparency, a mirror extending obliquely downwardly below the Fresnel lens from its rearward edge toward its forward edge, a lamp above the Fresnel lens at one of its forward corners, and an objective catadioptric reflector below the Fresnel lens at the other of its forward corners, the catadioptric reflector having an extremely wide field angle and a pair of semi-field conjugate surfaces, both on the same side of the catadioptric reflector, one of which is disposed at the visual transparency and the other of which is disposed at the viewing screen.

Other objects will in part be obvious and will in part appear hereinafter.

The invention accordingly comprises the apparatus, together with its components and their interrelationships, which are exemplified in the present disclosure, the scope of which will be indicated in the appended claims.

BRIEF DESCRIPTION OF THE DRAWINGS

For a fuller understanding of the nature and objects of the present invention, reference is made to the following detailed description, which is to be taken in connection with the accompanying drawing, wherein.

DETAILED DESCRIPTION

Figure 1:
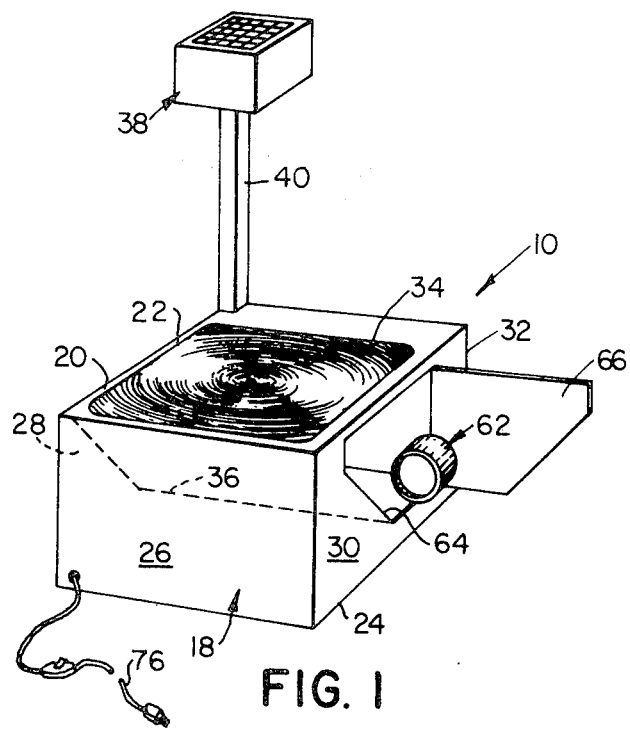
FIG. 1 is a perspective view of a visual transparency projector incorporating the present invention.
Figure 2:
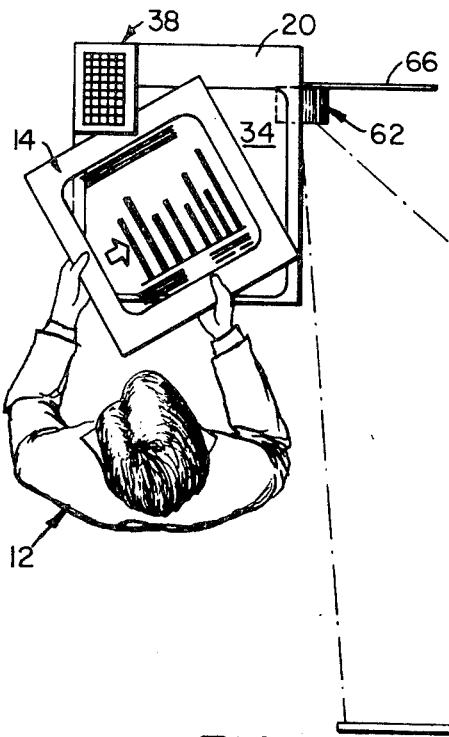
FIG. 2 is a top plan view of the projector of FIG. 1 in use by an operator.
Figure 4:
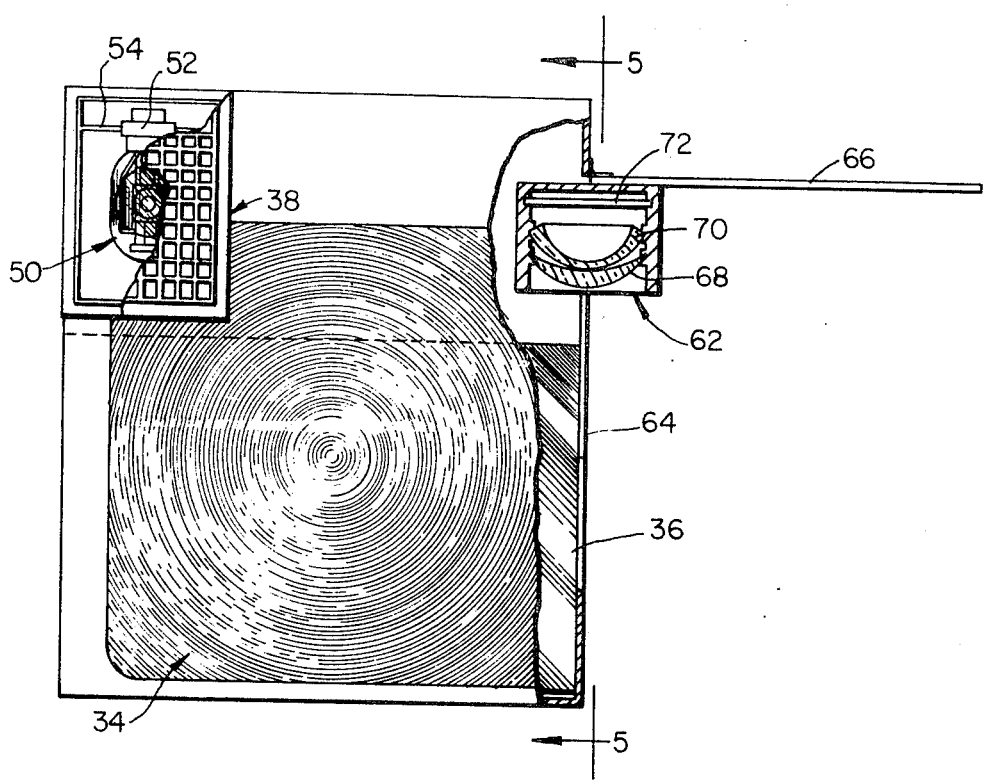
FIG. 4 is a top plan view of the projector of FIG. 1, with parts broken away.
Figure 5:
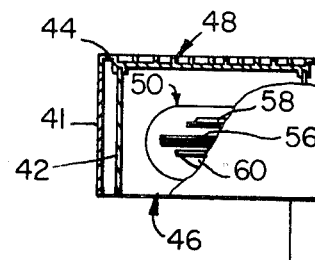
FIG. 5 is a side elevation of the projector of FIG. 1, taken substantially along the lines 5—5 of FIG. 1.
Figure 5:
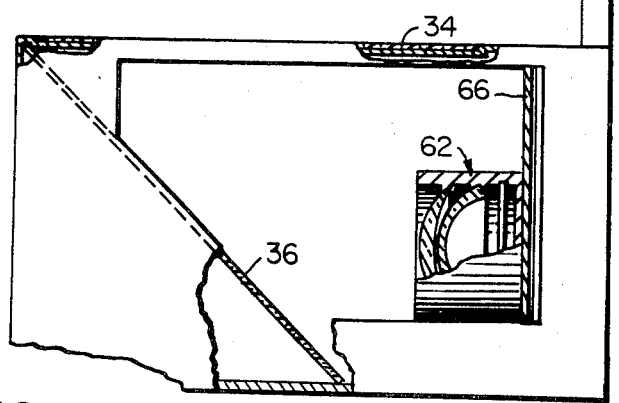

Generally, as shown in FIGS. 1 and 2, the illustrated projector 10 permits an operator 12 to display a visual transparency 14 on a viewing screen 16. The arrangement is such that (1) the audience has immediate visual communication with the projector in operation and the image on the viewing screen and (2) the operator has immediate visual communication with the visual transparency, the projector, the audience and the viewing screen.

Generally, projector 10 comprises a housing 18 having a top stage 20 with a generally rectangular opening 22 having rounded corners and extending throughout a major portion of its area, a bottom panel 24, a back panel 26, a pair of side panels 28, 30 and a front panel 32. Top stage 20 and bottom panel 24 are generally horizontal. Panels 26, 28, 30, 32 are generally vertical. Mounted in and extending throughout opening 22 is a Fresnel lens 34. Below Fresnel lens 34 is a plane mirror 36, which extends obliquely downwardly from the rear toward the front of housing 18 at an angle of approximately 45 degrees with respect to Fresnel lens 34. The rearward and forward edges of mirror 36 are straight, the rearward edge being approximately parallel to and relatively contiguous with the rearward edge of Fresnel lens 34 and the forward edge being approximately parallel to and relatively remote from the front edge of Fresnel lens 34.

A lamp casing 38 is mounted above Fresnel lens 34 at one of its front corners on a post 40, the lower end of which is fixed to housing 18 and the upper end of which is fixed to lamp casing 38. Casing 38 has outer and inner vertical side walls 41, 42 which are connected by ties 44. At its bottom 46, casing 38 is open. At its top 48, casing 38 has a reticulated grid of vertical ribs. A lamp 50 is mounted in casing 38 on a socket 52 which is carried by a bracket 54. Within a transparent glass envelope, lamp 50 has an incandescent filament 56, an upper reflector 58 and a lower condensing lens 60. When operating, lamp 50 is cooled convectively by air rising through casing 38 via opening 46 and reticulations 48. Illuminating light diverges from lamp 50 to Fresnel lens 34 along an axis that may be described as a resultant vector having three perpendicular coordinate vectors including a Y-axis vector extending in a direction toward rear panel 26, an X-axis vector extending in a direction toward panel 30, and a Z-axis vector extending in a direction toward Fresnel lens 34.

A catadioptric objective 62 is mounted below Fresnel lens 34 at one of its front corners as follows. In side panel 30 is an opening 64 for the exit of imaging light that has been transmitted by Fresnel lens 34 and deflected by mirror 36. Opening 64 has an oblique rearward edge that generally lies along a side edge of mirror 36, a vertical forward edge that is adjacent to front panel 32 and upper and lower generally horizontal edges. A closure 66, having a profile that registers with the profile of opening 64, is hinged to panel 30 for pivotal constraint about the axis of the vertical contiguous edges of opening 64 and closure 66. Objective 62 is mounted on closure 66 so as to be within housing 18 when closure 66 is closed and so as to be accessible optically to both mirror 36 and viewing screen 16 when closure 66 is open. When open, closure 66 shields the audience from stray light escaping from opening 64.

As shown, objective 62 comprises, in sequence, a rearwardly convex front lens 68, a rearwardly convex inner lens 70 and a plane rear mirror 72. Specifically lens 68 is a positive meniscus and lens 70 is a negative meniscus, which together constitute the front or the rear half of an extreme wide angle symmetrical four element lens heretofore sold by Bausch and Lomb under the trademark "Metrogon". By proper positioning of mirror 72, objective 62 is the catadioptric analog of the aforementioned extreme wide angle lens. Preferably objective 62 has a focal length of at least 125 millimeters (5 inches) and a total field angle of at least 75°. It will be appreciated, however, that other configurations of lenses 68, 70 and mirror 36 are possible in the herein disclosed combination of Fresnel lens, oblique mirror and catadioptric objective. Mirror 36, for example in other configurations, is either spherically or aspherically curved to correct third and fifth order aberrations.

Figure 3:
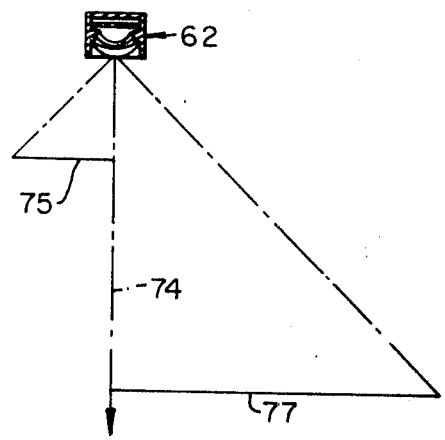
FIG. 3 is an optical diagram illustrating certain principles of the present invention.

The arrangement is such that imaging light converges along a first imaging axis segment extending from Fresnel lens 34 to mirror 36 and along a second imaging axis segment extending from mirror 36 to objective 62. The first imaging axis segment may be described as a resultant vector having three perpendicular coordinate vectors including a Y-axis vector extending in a direction toward rear panel 26, and X-axis vector extending in a direction toward panel 30, and a Z-axis vector extending in a direction toward mirror 36. The second imaging axis segment may be described as a resultant vector having three perpendicular coordinate vectors including a Y-axis vector extending in a direction toward front panel 32, an X-axis vector extending in a direction toward panel 30 and a Z-axis vector that may be zero or may extend upwardly. In any event, as shown in FIG. 3, the semi-field conjugate surface 75 of Fresnel lens 34 and the semi-field conjugate surface 77 of viewing screen 16 are disposed on opposite sides of the axis 74 of objective 62. The long focal length of objective 62, which is characterized by continuous optical surfaces of all of its elements at its axis, is responsible for a semi-field that is large enough to encompass Fresnel lens 34. Also, the position of the catadioptric objective at the front of the housing results in a short throw by which the distance from the rear of the housing to the screen ranges from 900 to 1800 millimeters (3 to 6 feet). And the orientation of the deflecting mirror ensures that part of the path between the Fresnel lens and the catadioptric objective is horizontal so that the height of the housing is low.

OPERATION

When not in use, closure 66 is closed and objective 62 is confined within housing 18. When in use, closure 66 is opened and objective 62 is oriented to include Fresnel lens 34 in one of its semi-fields and viewing screen 16 in the other of its semi-fields. Next lamp 50 is energized by a switch that controls power through a electrical cord 76, which extends through post 40 and housing 18 and through an opening in rear panel 26 to a suitable power source. The projector now is ready to image a visual transparency 14 onto screen 16. Because of the oblique incidence of illuminating light from lamp housing 38, undesired reflected light from the visual transparency and the Fresnel lens are cast rightwardly and rearwardly rather than directly into the operators eyes. The visual subject is correctly viewed by the operator and the image is correctly viewed by the audience because the image of the underside of the visual transparency is inverted by mirror 36, inverted and reverted by lenses 68, 70 and inverted by mirror 72.

The present invention thus provides a short throw, oblique incidence visual transparency projector that is seen together with a viewing screen naturally by an audiency and that is used in conjunction with visual transparencies naturally by an operator. Since certain changes may be made in the present disclosure without departing from its scope, it is intended that all matter contained in the foregoing specification and shown in the accompanying drawings be interpreted in an illustrative and not in a limiting sense.

What is claimed is:

1. A large copy projector for imaging a visual sheet on a viewing screen, said projector comprising:
    a. Fresnel field lens means having a first axis;
    b. wide angle catadioptric objective reflector means having a second axis;
    c. deflecting mirror means obliquely disposed with respect to said first axis and said second axis;
    d. said objective reflector means establishing a first conjugate surface and a second conjugate surface;
    e. said first conjugate surface including said visual sheet in association with said Fresnel lens means;
    f. said second conjugate surface including said viewing screen;
    g. said deflecting mirror means establishing a folded path involving said first conjugate surface and said second conjugate surface; and
    h. lamp means for illuminating said folded path.

2. The large copy projector of claim 1 wherein said objective reflector includes at least positive lens means and mirror means, said positive lens means presenting at least a convex surface optically toward said first conjugate surface and said second conjugate surface, said mirror means receiving light through said convex surface and returning light through said convex surface.

3. The large copy projector of claim 1 wherein said lamp means projects light through said visual sheet and said Fresnel field lens means.

4. The large copy projector of claim 1 wherein the front face of said visual sheet is accessible visually and manually to an operator and the rear face of said visual sheet presents imaging light that is inverted by said deflecting mirror and that is inverted twice and reverted by said catadioptric reflector.

5. The larger copy projector of claim 1 wherein the axis of illuminating light from said lamp means diagonally intersects the plane of said surface of said Fresnel lens.

6. A large copy projector for imaging a visual sheet on a viewing screen, said projector comprising a lower housing, an upper casing, and a post extending between and fixed to said housing and said casing, said housing including an upper stage having an upper opening, side panels having a lower opening, a Fresnel lens at said upper opening, said Fresnel lens having an axis, a wide field catadioptric reflector at said lower opening, said catadioptric reflector having an axis, said Fresnel lens having an axis, a deflecting mirror extending obliquely with respect to said axis of said Fresnel lens and said axis of said catadioptric reflector, and a lamp in said casing, said lamp directing diverging illuminating light along an illuminating axis segment that is oblique with respect to said axis of said Fresnel lens, said deflecting mirror establishing a folded optical path for converging imaging light from said Fresnel lens to said catadioptric reflector and for directing diverging imaging light from said catadioptric reflector to a viewing screen.

7. The large copy projector of claim 6 wherein said Fresnel lens is generally rectangular having a rearward edge, a forward edge and a pair of side edges, said deflecting mirror having an upper rearward edge and a lower forward edge.

8. The large copy projector of claim 7 wherein said lamp is positioned at one of said side edges of said Fresnel lens and said catadioptric reflector is positioned at the other of said side edges of said Fresnel lens.

9. The large copy projector of claim 8 wherein said catadioptric reflector defines a pair of conjugate surfaces, one of said conjugate surfaces including said visual sheet and the other of said conjugate surfaces including an image thereof, said one of said conjugate surfaces being within one portion of said wide field angle, said conjugate surfaces being within another portion of said wide field angle.

10. The large copy projector of claim 9 wherein the focal length of said catadioptric reflector is at least 125 millimeters.

11. The large copy projector of claim 10 wherein said catadioptric reflector includes at least a positive lens and an axial mirror, said positive lens presenting at least a convex refracting surface toward said conjugate surface.

12. The large copy projector of claim 11 wherein said positive lens and said mirror are continuous at said axis of said catadioptric reflector.

13. The large copy projector of claim 12 wherein said positive lens is a meniscus lens.

14. The large copy projector of claim 13 wherein said catadioptric reflector includes a negative meniscus lens between said positive lens and said axial mirror.

* * * * *